(12) United States Patent
Grillot et al.

(10) Patent No.: US 8,507,929 B2
(45) Date of Patent: Aug. 13, 2013

(54) SEMICONDUCTOR LIGHT EMITTING DEVICE INCLUDING GRADED REGION

(75) Inventors: Patrick N. Grillot, San Jose, CA (US);
Rafael I. Aldaz, Santa Clara, CA (US);
Eugene I. Chen, Palo Alto, CA (US);
Sateria Salim, San Jose, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 258 days.

(21) Appl. No.: 12/139,999

(22) Filed: Jun. 16, 2008

(65) Prior Publication Data

US 2009/0309111 A1 Dec. 17, 2009

(51) Int. Cl.
*H01L 33/00* (2010.01)
*H01L 33/12* (2010.01)
*H01L 21/00* (2006.01)

(52) U.S. Cl.
CPC .............. *H01L 33/12* (2013.01); *H01L 33/00* (2013.01)
USPC .................. 257/97; 257/94; 257/95; 257/96; 257/E33.023; 257/E33.032; 438/46; 438/47

(58) Field of Classification Search
CPC ............................... H01L 33/12; H01L 33/30
USPC ................................................ 257/E33.032
See application file for complete search history.

(56) References Cited

U.S. PATENT DOCUMENTS

| | | | |
|---|---|---|---|
| 6,064,076 A | 5/2000 | Chen et al. | |
| 6,100,544 A * | 8/2000 | Lin et al. | 257/94 |
| 6,396,862 B1 * | 5/2002 | Wang et al. | 372/46.01 |
| 2001/0047751 A1 | 12/2001 | Kim et al. | |
| 2002/0104996 A1* | 8/2002 | Kuo et al. | 257/79 |
| 2004/0099872 A1 | 5/2004 | McGill et al. | |
| 2004/0224434 A1* | 11/2004 | Shibata et al. | 438/46 |
| 2004/0227148 A1 | 11/2004 | Camras et al. | |
| 2006/0163603 A1* | 7/2006 | Takeuchi et al. | 257/103 |
| 2008/0093612 A1 | 4/2008 | Konno et al. | |
| 2009/0152584 A1* | 6/2009 | Grillot et al. | 257/101 |

FOREIGN PATENT DOCUMENTS

| | | |
|---|---|---|
| EP | 0540799 A1 | 5/1993 |
| JP | 06061525 A | 3/1994 |
| JP | 2001015805 A | 1/2001 |

* cited by examiner

*Primary Examiner* — Michael Jung

(57) ABSTRACT

One or more regions of graded composition are included in a III-P light emitting device, to reduce the $V_f$ associated with interfaces in the device. In accordance with embodiments of the invention, a semiconductor structure comprises a III-P light emitting layer disposed between an n-type region and a p-type region. A graded region is disposed between the p-type region and a GaP window layer. The aluminum composition is graded in the graded region. The graded region may have a thickness of at least 150 nm. In some embodiments, in addition to or instead of a graded region between the p-type region and the GaP window layer, the aluminum composition is graded in a graded region disposed between an etch stop layer and the n-type region.

17 Claims, 4 Drawing Sheets

SEMICONDUCTOR LIGHT EMITTING DEVICE INCLUDING GRADED REGION

BACKGROUND

Description of Related Art

Light emitting diodes (LEDs) are widely accepted as light sources in many applications that require low power consumption, small size, and high reliability. Energy-efficient diodes that emit light in the yellow-green to red regions of the visible spectrum contain active layers formed of an AlGaInP alloy. FIGS. 1 and 2 show the fabrication of a conventional transparent substrate (TS) AlGaInP LED. In FIG. 1, an etch stop layer 12 such as a 1000 Å n-$In_{0.5}Ga_{0.5}P$ layer, is grown over a semiconductor substrate 10, typically GaAs. Device layers 14, including a lower confining layer, at least one $(Al_xGa_{1-x})_yIn_{1-y}P$ active layer, and an upper confining layer, all placed in a double heterostructure configuration, are grown over etch stop layer 12, followed by an optional thick (for example, between 5 and 100 µm thick) window layer 16, often p-type GaP grown by vapor phase epitaxy. The confining layers are made of a transparent semiconductor and enhance the internal quantum efficiency of the LED, defined as the fraction of electron-hole pairs in the active layer that recombine and emit light. The window layer 16, also a transparent semiconductor, increases the spread of electric current across the active layer and enhances the internal quantum efficiency and extraction efficiency of the LED. The light emitting region may consist of a single thick uniform composition layer or a series of thin wells and barriers.

GaAs is preferred as a growth substrate because it is lattice matched to $(Al_xGa_{1-x})_yIn_{1-y}P$ at compositions favored for the formation of LEDs that emit light in the yellow-green to red regions of the visible spectrum, at y~0.5. Since GaAs is absorbing, it is typically removed and replaced by a transparent substrate 18, as illustrated in FIG. 2. GaAs substrate 10, shown in FIG. 1, is removed by an etch that etches GaAs at a much faster rate than etch stop layer 12. A transparent substrate 18, typically n-type GaP, is wafer bonded to the lower surface of the epitaxial structure (etch stop layer 12 in FIG. 2), generally by annealing the structure at an elevated temperature while uniaxial force is applied. LED chips are then processed from the bonded wafers using conventional metal contacts and chip fabrication techniques suitable for the p-type epitaxial GaP anode and the n-type wafer-bonded GaP cathode.

As used herein, "AlGaInP" and "III-P" may refer to any binary, ternary, or quaternary alloy of aluminum, gallium, indium and phosphorus.

SUMMARY

One or more regions of graded composition are included in a III-P light emitting device, to reduce the $V_f$ associated with interfaces in the device. In accordance with embodiments of the invention, a semiconductor structure comprises a III-P light emitting layer disposed between an n-type region and a p-type region. A graded region is disposed between the p-type region and a GaP window layer. The aluminum composition is graded in the graded region. In some embodiments, the graded region has a thickness of at least 150 nm. In some embodiments, in addition to or instead of a graded region between the p-type region and the GaP window layer, the aluminum composition is graded in a graded region disposed between an etch stop layer and the n-type region.

In some embodiments, the graded region is divided into regions with different grading profiles. For example, in a first region, the aluminum composition may be graded from an aluminum composition in the p-type region to an aluminum composition in the light emitting layer. In a second region, the aluminum composition may be graded from an aluminum composition in the light emitting layer to zero.

DETAILED DESCRIPTION

Figure 1:
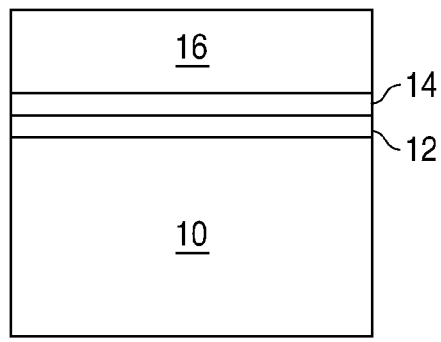
FIG. 1 illustrates a prior art AlGaInP LED device structure grown over an absorbing substrate.
Figure 2:
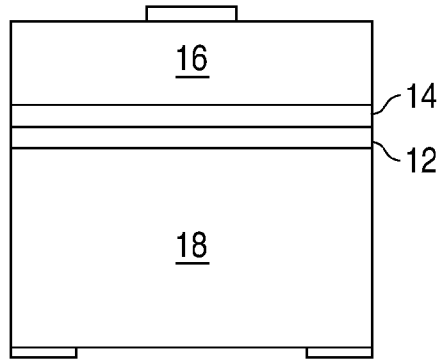
FIG. 2 illustrates a prior art transparent substrate AlGaInP LED.

In the device illustrated in FIGS. 1 and 2, the upper confining layer is often AlInP or AlGaInP. The upper confining layer may also be referred to as the upper setback layer. As used herein, "upper confining layer" may refer to any binary, ternary, or quaternary alloy of aluminum, gallium, indium and phosphorus proximate the active layer.

Figure 3:
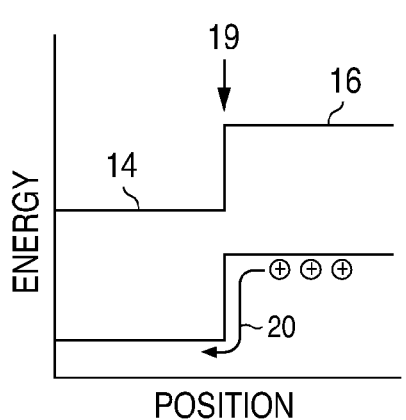
FIG. 3 is an energy band diagram of the interface between an AlGaInP confining layer and a GaP window layer.

FIG. 3 illustrates the energy band diagram at the interface between a p-type AlGaInP upper confining layer (one of device layers 14) and a GaP window layer 16. At the interface 19 between the two layers, holes flowing toward the light emitting layer must have enough energy to flow over energy barrier 20. The energy barrier 20 that the holes must climb at interface 19 undesirably adds to the forward voltage $V_f$ of the device.

Embodiments of the invention may reduce the $V_f$ associated with interfaces in the device; in particular, at the interface between the window layer and the device layers.

Figure 4:
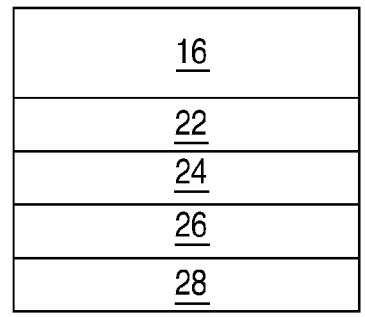
FIG. 4 illustrates a portion of a device with a graded region disposed between an AlInP confining layer and the window layer.

In a first embodiment of the invention, a graded region is disposed between the upper confining layer and the window layer. FIG. 4 illustrates a portion of a device according to the first embodiment of the invention. The device layers beneath the active region, including an n-type confining layer, are not shown in FIG. 4. An active region, including at least one light emitting layer, is depicted in FIG. 4 as layer 28. An upper confining layer 26 designed to confine electrons and holes in active region 28 and usually a quaternary AlGaInP layer, is grown over active region 28, followed by a ternary AlInP confining layer 24. Alternatively, layer 24 may be an AlGaInP layer with Al composition or bandgap higher than that of upper confining layer 26.

A graded region 22 is disposed between AlInP layer 24 and window layer 16. In some devices according to the first embodiment, the composition is graded from AlInP that is 50% Al to InGaP that is about 50% Ga. In effect, the Al atoms are gradually replaced by Ga over the thickness of graded region 22. Graded region 22 may be, for example, 100-500 nm thick in some devices, at least 150 nm thick in some devices, 300-400 nm thick in some devices, and at least 300 nm thick in some devices. While the Al composition of graded region 22 is normally graded to zero, it need not be. For example, graded region 22 may be graded to a composition other than $In_{0.5}Ga_{0.5}P$, such as $(Al_{0.1}Ga_{0.9})_{0.5}In_{0.5}P$. While the In composition of graded region 22 is normally maintained at a constant value of 50%, which is lattice matched to the light emitting layer or layers in the active region and the GaAs growth substrate, it need not be. For example, graded region 22 may be graded to a composition other than $In_{0.5}Ga_{0.5}P$, such as $(Al_xGa_{1-x})_{0.55}In_{0.45}P$, or $(Al_xGa_{1-x})_{0.45}In_{0.5}P$.

Figure 11:
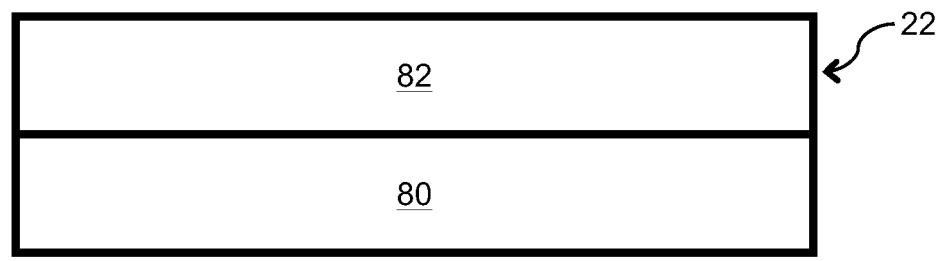
FIG. 11 illustrates a graded region with two graded portions.

Window layer 16, typically p-type GaP, is grown over graded region 22. In some embodiments, at the interface between graded region 22 and window layer 16, the composition abruptly switches from approximately $In_{0.5}Ga_{0.5}P$ to GaP. In other embodiments, the In composition is graded. The In composition may be graded in the same part of graded region 22 where the Al composition is graded, or alternatively, as illustrated in FIG. 11, the In composition may be graded in a first portion 80 of graded region 22 while the Al composition is graded in a second portion 82 of graded region 22.

Figure 5:
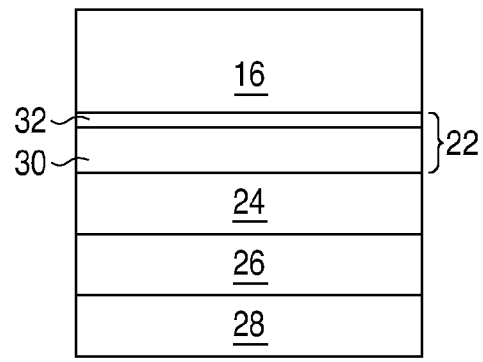
FIG. 5 illustrates a portion of a device with a graded region including multiple regions with different grading profiles.

In a second embodiment of the invention, a graded region is disposed between the upper confining layer and the window layer. The graded region is divided into two or more regions with different grading profiles. FIG. 5 illustrates a portion of a device according to the second embodiment of the invention. Like the device of FIG. 4, an upper confining layer 26 is formed over the active region 28. An AlInP layer 24 is formed over the upper confining layer. A graded region 22 is disposed between AlInP layer 24 and GaP window layer 16. Graded region 22 includes a first region 30 adjacent AlInP layer 24, and a second region 32 adjacent window layer 16. The grading profiles are different in regions 30 and 32.

Figure 6:
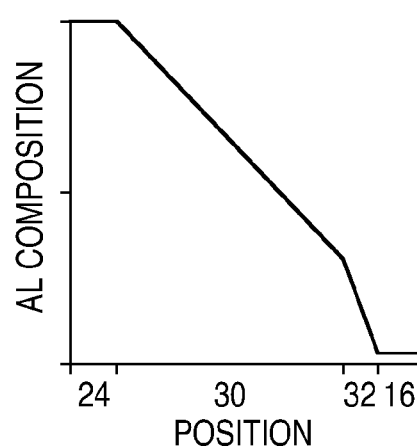
FIG. 6 is a plot of Al composition as a function of position for part of the structure illustrated in FIG. 5.

FIG. 6 illustrates Al composition as a function of position for a portion of one example of device according to FIG. 5. The uniform, high Al composition AlInP layer 24 is shown on the left hand side of FIG. 6. In the first region 30 of graded region 22, the Al composition is graded from that of AlInP layer 24, to a lower Al composition, usually in a quaternary layer. In the second region 32 of graded region 22, the Al composition is graded from that of the quaternary composition at the end of first region 30 to a composition with little or no Al, usually InGaP, at the interface with window layer 16. Both grading profiles in regions 30 and 32 illustrated in FIG. 6 are linear, monotonic grades. The composition in second graded region 32 is changed more quickly than that in first graded region 30.

A graded region including multiple regions with different grading profiles such as the device illustrated in FIG. 6 is appealing for devices that emit light at short wavelengths. Shorter wavelengths are more readily absorbed by the lowest-Al compositions in graded region 22. The Al composition is gradually graded to the lowest Al composition that does not absorb light in first region 30 (i.e. the light emitting layer composition), then quickly graded through the absorbing compositions in second region 32. First region 30 is generally thicker than second region 32. In some devices, second region 32 is between 5 and 15% of the thickness of first region 30. For example, first region 30 may be between 100 and 500 nm thick, and is often between 300 and 400 nm thick. Second region 32 may be between 2 and 50 nm thick, and is often between 20 and 40 nm thick.

Figure 7:
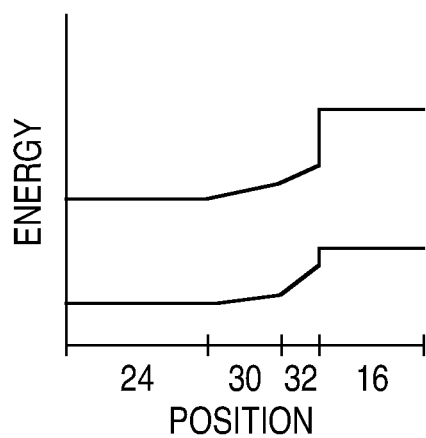
FIG. 7 is a plot of bandgap as a function of position for part of the structure illustrated in FIG. 5.

FIG. 7 illustrates bandgap as a function of position for a portion of one example of a device according to FIG. 5. The graded composition regions in FIGS. 5 and 6 result in graded bandgap profiles, which at least partially smooth out the energy barrier in FIG. 3. The bandgap profile shown in FIG. 7 is constructed from first region 30 of graded region 22, which is substantially transparent to light emitted by the light emitting layer, and second region 32 of graded region 22, which is substantially absorbing to light emitted by the light emitting layer.

The composition of the light emitting layers of the active region is $(Al_xGa_{1-x})_yIn_{1-y}P$, where $y\sim0.5$. A device that emits amber light may have an Al composition in the light emitting layer of x=0.3. In first region 30, the composition is graded from $Al_{0.5}In_{0.5}P$ to $(Al_{0.3}Ga_{0.7})_{0.5}In_{0.5}P$ over a thickness of 100-400 nm. In second region 32, the composition is graded from $(Al_{0.3}Ga_{0.7})_{0.5}In_{0.5}P$ to InGaP over a thickness of 10-40 nm. A device that emits orange light may have an Al composition in the light emitting layer of x=0.1-0.15. In first region 30, the composition is graded from $Al_{0.5}In_{0.5}P$ to $(Al_{0.15}Ga_{0.85})_{0.5}In_{0.5}P$ over a thickness of 100-400 nm. In second region 32, the composition is graded from $(Al_{0.15}Ga_{0.85})_{0.5}In_{0.5}P$ to InGaP over a thickness of 2-40 nm. A device that emits red light may have an Al composition in the light emitting layer of x=0.05-0.1. In first region 30, the composition is graded from $Al_{0.5}In_{0.5}P$ to $(Al_{0.1}Ga_{0.9})_{0.5}In_{0.5}P$ over a thickness of 100-400 nm. In second region 32, the composition is graded from $(Al_{0.1}Ga_{0.9})_{0.5}In_{0.5}P$ to InGaP over a thickness of 2-40 nm.

Figure 8:
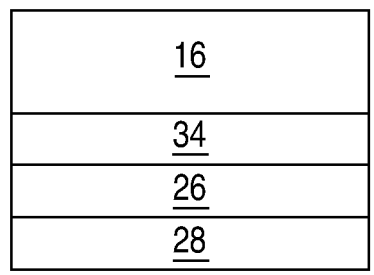
FIG. 8 illustrates a portion of a device with a graded region disposed between a quaternary confining layer and the window layer.

In a third embodiment of the invention, a graded region is disposed between the upper confining layer and the window layer, and AlInP confining layer 24 of FIGS. 4 and 5 is omitted from the device. FIG. 8 illustrates a portion of a device according to the third embodiment. An upper confining layer 26 is formed over the active region 28. Upper confining layer is generally a lattice-matched quaternary layer, i.e. $(Al_xGa_{1-x})_yIn_{1-y}P$, where $y\sim0.5$. The Al composition in confining layer 26 is generally $x\geq0.4$, often $x\geq0.65$. A graded region 34 is disposed between upper confining layer 26 and window layer 16. The Al composition in graded region 34 is graded from the composition of upper confining layer 26 to zero in the portion adjacent window layer 16. Graded region 34 may be, for example, 100-500 nm thick in some devices, and 300-400 nm thick in some devices.

As the Al-composition in a layer increases, the band gap of the layer increases, and accordingly the layer's ability to confine carriers increases. When AlInP layer 24 is omitted, the quaternary upper confining layer must have a high enough Al composition to provide sufficient carrier confinement. The difference between the Al composition x in the light emitting layers of the active region 28 and the Al composition x in the upper confining layer 26 is $\Delta x\geq0.4$ in some embodiments, $\Delta x\geq0.5$ in some embodiments, and $\Delta x\geq0.6$ in some embodiments. For example, a device that emits amber light may have a light emitting layer composition of $(Al_{0.3}Ga_{0.7})_{0.5}In_{0.5}P$. In some embodiments, the Al composition in the upper confining layer is at least x=0.7, or $(Al_{0.7}Ga_{0.3})_{0.5}In_{0.5}P$. In some embodiments, the Al composition in the upper confining layer is at least x=0.8, or $(Al_{0.8}Ga_{0.2})_{0.5}In_{0.5}P$. In some embodiments, the Al composition in the upper confining layer is at least x=0.9, or $(Al_{0.9}Ga_{0.1})_{0.5}In_{0.5}P$. A device that emits red light may have a light emitting layer composition of $(Al_{0.05}Ga_{0.95})_{0.5}In_{0.5}P$. In some embodiments, the Al composition in the upper confining layer is at least x=0.45, or $(Al_{0.45}Ga_{0.55})_{0.5}In_{0.5}P$. In some embodiments, the Al composition in the upper confining layer is at least x=0.55, or $(Al_{0.55}Ga_{0.45})_{0.5}In_{0.5}P$. In some embodiments, the Al composition in the upper confining layer is at least x=0.65, or $(Al_{0.65}Ga_{0.35})_{0.5}In_{0.5}P$. In some embodiments, the Al composition in the upper confining layer is at least x=0.8, or $(Al_{0.8}Ga_{0.2})_{0.5}In_{0.5}P$.

Figure 9:
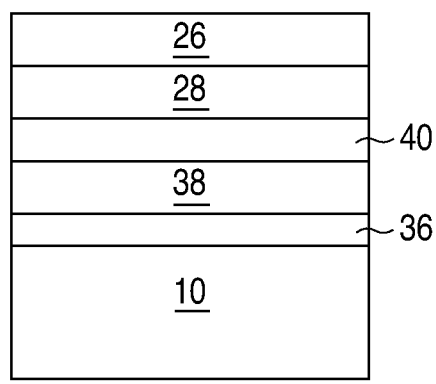
FIG. 9 illustrates a portion of a device with a graded region disposed between an etch-stop structure and a quaternary confining layer.

In a fourth embodiment of the invention, a graded region is disposed between the etch stop layer and the lower confining layer, on the n-type side of the active region. FIG. 9 illustrates a portion of a structure according to the fourth embodiment. An etch stop structure 36 is grown over a growth substrate 10, usually GaAs. A graded region 38 is grown over etch stop structure 36, followed by lower confinement layer 40, active region 28, and upper confinement layer 26. Any of the graded structures described in the embodiments above may be grown over upper confinement layer 26, followed by window layer 16 (not shown in FIG. 9).

Etch stop structure 36 may be, for example, one or more etch stop layers, separated by, for example, a GaAs layer. Etch stop layers may be, for example, InGaP. The top layer of etch stop structure is an etch stop layer, often InGaP.

The composition in graded region is graded from the composition of the top etch stop layer to the composition of lower confining layer. For example, lower confining layer is generally a lattice-matched quaternary layer, i.e. $(Al_xGa_{1-x})_yIn_{1-y}P$, where y~0.5. The Al composition in lower confining layer 40 is generally x≧0.4, often x≧0.65. Graded region 38 may be, for example, 40-100 nm thick in some devices, and 100-300 nm thick in some devices.

As with the upper confining layer described above, the quaternary lower confining layer must have a high enough Al composition to provide sufficient carrier confinement. The difference between the Al composition x in the light emitting layers of the active region 28 and the Al composition x in the lower confining layer 40 is Δx≧0.25 in some embodiments, Δx≧0.5 in some embodiments, and Δx≧0.6 in some embodiments. For example, a device that emits amber light may have a light emitting layer composition of $(Al_{0.3}Ga_{0.7})_{0.5}In_{0.5}P$. In some embodiments, the Al composition in the lower confining layer is at least x=0.65, or $(Al_{0.65}Ga_{0.35})_{0.5}In_{0.5}P$. In some embodiments, the Al composition in the lower confining layer is at least x=0.8, or $(Al_{0.8}Ga_{0.2})_{0.5}In_{0.5}P$. In some embodiments, the Al composition in the lower confining layer is at least x=0.9, or $(Al_{0.9}Ga_{0.1})_{0.5}In_{0.5}P$. A device that emits red light may have a light emitting layer composition of $(Al_{0.05}Ga_{0.95})_{0.5}In_{0.5}P$. In some embodiments, the Al composition in the lower confining layer is at least x=0.4, or $(Al_{0.4}Ga_{0.6})_{0.5}In_{0.5}P$. In some embodiments, the Al composition in the lower confining layer is at least x=0.55, or $(Al_{0.55}Ga_{0.45})_{0.5}In_{0.5}P$. In some embodiments, the Al composition in the lower confining layer is at least x=0.65, or $(Al_{0.65}Ga_{0.35})_{0.5}In_{0.5}P$.

The Al composition of the n-type lower confining layer may be lower than the Al composition of the p-type upper confining layer.

The embodiments described above may be combined. For example, the graded region described in the third and/or fourth embodiments may include regions with different grading profiles, as described in the second embodiment. A device may include graded regions on both the n-type and p-type sides of the active region.

Though the above examples describe regions with linear grading profiles, as used herein, the term "graded region" is meant to encompass any structure that achieves a change in composition in any manner other than a single step in composition. In one example, the graded region is a stack of layers, each of the layers having a different composition than either layer adjacent to it. If the layers are of resolvable thickness, the graded region is known as a step-graded or index-graded region. In the limit where the thickness of individual layers approaches zero, the graded region is known as a continuously-graded region. The layers making up the graded region can be arranged to form a variety of profiles in composition versus thickness, including, but not limited to, linear grades, parabolic grades, and power-law grades. Also, graded regions are not limited to a single grading profile, but may include portions with different grading profiles and one or more portions with substantially constant composition.

The structures illustrated in FIGS. 4, 5, 7, 8 and 9 may be processed into transparent substrate devices as illustrated and described in FIG. 2 and accompanying text. For example, the growth substrate is removed by an etch that terminates on an etch stop structure. The semiconductor layers are then connected to a transparent substrate, and contacts are formed on opposite sides of the device. Alternatively, the structures illustrated in FIGS. 4, 5, 7, 8 and 9 may be processed into flip-chip devices, where a portion of the semiconductor layers are etched away to reveal a p-type or n-type layer, then both the p-type and n-type contacts are formed on the same side of the device.

Figure 10:
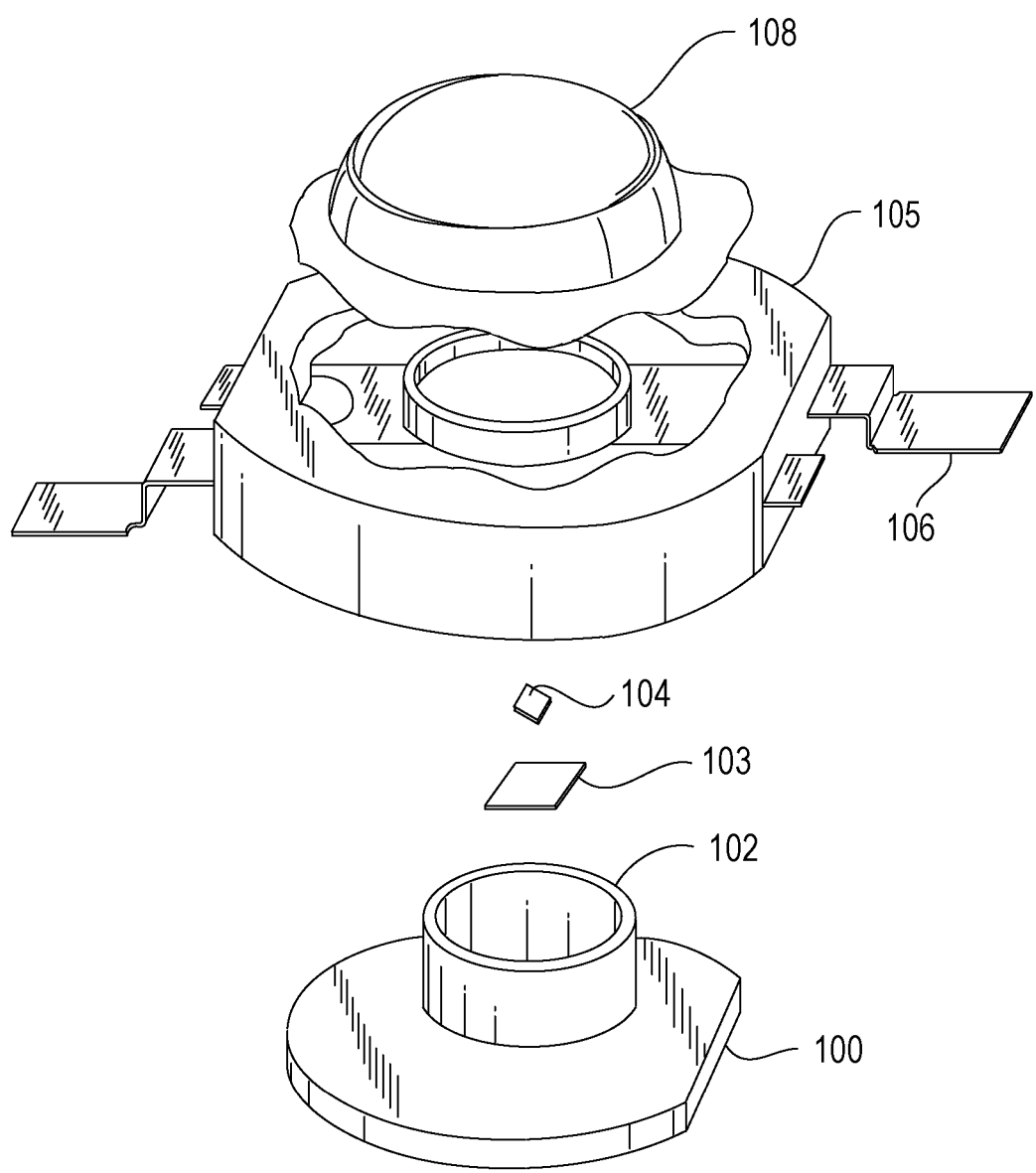
FIG. 10 is an exploded view of a packaged light emitting device.

FIG. 10 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting submount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
    a semiconductor structure comprising a III-P light emitting layer disposed between an n-type region and a p-type region;
    a GaP window layer; and
    a graded region disposed between the p-type region and the GaP window layer, wherein the graded region comprises a portion where a composition of aluminum is continuously graded and a composition of indium is constant, wherein the indium composition is constant in the same part of the graded region where the composition of aluminum is continuously graded, and the graded region has a thickness of at least 150 nm.

2. The device of claim 1 wherein the composition of aluminum in the graded region is graded from a composition in the p-type region to zero.

3. The device of claim 1 wherein the p-type region comprises a layer of $(Al_xGa_{1-x})_yIn_{1-y}P$ where x ≧0.4 in direct contact with the graded region.

4. The device of claim 1 wherein the p-type region comprises an AlInP layer in direct contact with the graded region.

5. The device of claim 1 wherein the graded region is a first graded region, the device further comprising:
an etch stop layer; and
a second graded region disposed between the etch stop layer and the n-type region, wherein a composition of aluminum is graded in the second graded region.

6. The device of claim 5 wherein the composition of aluminum in the second graded region is graded from zero to a composition in the n-type region.

7. The device of claim 5 wherein an etch stop layer in direct contact with the graded region is InGaP, and an n-type layer in direct contact with the graded region is $(Al_xGa_{1-x})_yIn_{1-y}P$ where $x \geq 0.4$.

8. The device of claim 5 wherein a thickness of the second graded region is greater than 40 nm.

9. The device of claim 1 wherein the composition of aluminum in the graded region is graded from a composition in the p-type region to a non-zero value.

10. A device comprising:
a semiconductor structure comprising a III-P light emitting layer disposed between an n-type region and a p-type region;
a GaP window layer; and
a graded region disposed between the p-type region and the GaP window layer, wherein:
a composition of aluminum is graded in the graded region; and
the graded region comprises a first portion having a first grading profile and a second portion having a second grading profile, wherein the first and second grading profiles are different and within each of the first and second portions, the composition of aluminum is changed in a manner other than a single step in composition.

11. The device of claim 10 wherein the graded region has a thickness of at least 100 nm.

12. The device of claim 10 wherein the graded region has a thickness of at least 300 nm.

13. The device of claim 10 wherein:
the first portion is proximate to the p-type region and the second portion is proximate to the window layer;
an aluminum composition in the first portion is graded from an aluminum composition in the p-type region to an aluminum composition in the light emitting layer; and
an aluminum composition in the second portion is graded from an aluminum composition in the light emitting layer to an aluminum composition that is less than the aluminum composition in the light emitting layer.

14. The device of claim 13 wherein the aluminum composition in the second portion is graded from an aluminum composition in the light emitting layer to zero.

15. The device of claim 10 wherein the first portion is thicker than the second portion.

16. The device of claim 10 wherein a slope of a line representing aluminum composition as a function of position is steeper for the second portion than the first portion.

17. The device of claim 10 wherein:
the first portion is substantially transparent to light emitted by the light emitting layer; and
the second portion is substantially absorbing to light emitted by the light emitting layer.

* * * * *